United States Patent [19]

Furukawa et al.

[11] Patent Number: 5,227,363
[45] Date of Patent: Jul. 13, 1993

[54] MOLECULAR BEAM EPITAXY PROCESS OF MAKING SUPERCONDUCTING OXIDE THIN FILMS USING AN OXYGEN RADICAL BEAM

[75] Inventors: Hiroaki Furukawa; Masao Nakao, both of Ibaraki, Japan

[73] Assignee: Sanyo Electric Co., Ltd., Osaka, Japan

[21] Appl. No.: 838,525

[22] Filed: Feb. 19, 1992

[30] Foreign Application Priority Data

Feb. 20, 1991 [JP] Japan .................................. 3-26373
Mar. 25, 1991 [JP] Japan .................................. 3-60392
Jul. 18, 1991 [JP] Japan .................................. 3-178195

[51] Int. Cl.$^5$ .............................................. B05D 5/12
[52] U.S. Cl. ........................................ 505/1; 505/730;
427/62; 427/564; 427/314; 427/126.3;
427/419.2; 427/419.3
[58] Field of Search ........................... 505/1, 730, 732;
427/62, 63, 314, 42, 126.3, 564, 419.2, 419.3;
118/715, 726; 428/930

[56] References Cited

U.S. PATENT DOCUMENTS 5,135,906 8/1992 Harada et al. .............................. 505/1
5,143,896 9/1992 Harada et al. .............................. 505/1

OTHER PUBLICATIONS

Nakao et al., "Superconductivity in $B_iS_rC_aC_uO$ superlattices: two-dimensional Properties of CuO planes", Jpn. J. Appl. Phys. 30(12B, Dec. 1991, pp. 3929-3932.
Furukawa et al., "In-Situ Epitaxial Growth of $B_i$-$S_i$-$C_a$-$C_u$-O films and superlattices by MBE using an oxygen radical beam", Physica C 185-189 (1991) pp. 2083-2084.
Schlom et al., "Molecular Beam Epitaxy of layered $D_y$-$B_a$-$C_u$-O compounds" MRS (Reno, Nev.) Apr. 1988 pp. 197-200.
Eckstein et al., "Epitaxial growth of high-temperature superconducting thin films", J. Vac. Sci. Technol. B7(2), Mar./Apr. 1989 pp. 319-323.
Schlom et al., "Molecular beam epitaxy-a path to novel high-Tc superconductors?", Proc. SPIE-Int. Soc. Opt. Eng., 1287 (High Tc Supercond. Thin Films Appl.), 1990 pp. 152-165.
"Advances in Superconductivity III"; Furukawa et al.; Proceedings of the 3rd International Symposium on Superconductivity (ISS '90), Nov. 6-9, 1990 pp. 1-4.
"Parameters for in situ growth of high Tc superconducting thin films using an oxygen plasma source", Spah et al.; Amer. Inst. of Physics, Aug. 1988, pp. 441-443.
"In situ epitaxial growth of $Y_1Ba_2Cu_3O_{7-x}$ films by molecular beam epitoxy with an activated oxygen source"; Kwo et al; Amer. Inst. of Physics, Dec. 1988 pp. 2683-2685.

*Primary Examiner*—Shrive Beck
*Assistant Examiner*—Roy V. King
*Attorney, Agent, or Firm*—Spensley Horn Jubas & Lubitz

[57] ABSTRACT

A method makes a superconducting oxide thin film by irradiating an oxygen radical beam with necessary elements of the compound onto a substrate mounted in a molecular beam epitaxy system. The process can selectively form the superconducting oxide thin film on the substrate more efficiently in a direct reaction manner while maintaining the vacuum chamber of the molecular beam epitaxy system at a higher vacuum level.

11 Claims, 14 Drawing Sheets

MOLECULAR BEAM EPITAXY PROCESS OF MAKING SUPERCONDUCTING OXIDE THIN FILMS USING AN OXYGEN RADICAL BEAM

BACKGROUND OF THE INVENTION

1. Field of the Invention

The present invention relates to a process of selectively preparing a high-quality superconducting oxide thin film on the substrate of an electronic superconducting device.

2. Description of the Related Art

In recent years, various superconducting oxide materials such as yttrium (Y), bismuth (Bi) and thallium (Tl) compounds have been discovered which can exhibit superconductivity at their critical temperature which is higher than the temperature of liquid nitrogen. Studies are actively being undertaken to enable the application of thin films formed from these superconducting oxide materials to electronic superconducting devices. In order to provide good device properties, it is first necessary to prepare a high-quality superconducting oxide thin film having a smooth surface on a dielectric or semiconductor substrate.

The current methods of preparing the superconducting oxide thin film include sputtering, reactive co-evaporation, laser ablation, molecular beam epitaxy (MBE) and MOCVD. Among them, MBE is a film forming process which is superior in film thickness at atomic layer level and in controllability of crystalline structure. Such a process can prepare a thin film having an excellent evenness.

In order to realize the molecular beam state of evaporating matter, the MBE process requires the maintaining of a high vacuum growth chamber so that the mean free path of the evaporating matter will be maintained sufficiently. When an oxide thin film is to be produced by the MBE process, sufficient oxygen must be supplied to the thin film while maintaining a high vacuum. Since the oxygen molecules are less reactive, an increased amount of oxygen must be introduced into the growth chamber so as to supply the necessary amount of oxygen into the thin film. If the normal oxygen $O_2$ is introduced into the growth chamber, the degree of vacuum in the growth chamber will be extremely deteriorated. Therefore active sources of oxygen such as ozone $O_3$, nitrogen dioxide $NO_2$ and the like are now used to oxidize the thin film more effectively with a minimum amount of oxygen which is introduced from out side of the growth chamber.

The effective oxidization of the thin film with ozone or nitrogen dioxide is due to the fact that the active oxygen source can be easily decomposed to form oxygen radicals (also called excited state, nascent state and atomic state oxygen) which are very active for oxidization ($O_3 \rightarrow O^* + O_2$, $NO_2 \rightarrow O^* + NO$). On the contrary, the non-decomposed oxygen molecules are less active than the oxygen radicals.

However, $O_2$ and NO produced from ozone or nitrogen dioxide simultaneously with the production of oxygen radicals will deteriorate the degree of vacuum in the growth chamber of the molecular beam epitaxy system since they remain in the chamber. In order to decompose ozone or nitrogen dioxide, it is further necessary to obtain thermal energy from the substrate surface. Additionally, the ozone and nitrogen dioxide can be reactive only after they have diffused to some extent on the surface of the substrate.

SUMMARY OF THE INVENTION

It is therefore an object of the present invention to provide a process of selectively making a superconducting oxide thin film on a substrate with an increased efficiency and in a direct reaction manner by maintaining the vacuum chamber of the molecular beam epitaxy system at higher degrees of vacuum.

To this end, the present invention provides a process of making a superconducting oxide thin film, characterized by the step of irradiating an oxygen radical beam with the necessary elements of components onto a substrate mounted on the molecular beam epitaxy system to form a superconducting oxide thin film.

Oxygen radicals are produced from the decomposition of oxygen molecules ($O_2 \rightarrow 2O^*$). The oxygen radical beam is formed when the oxygen molecules are decomposed before reaching the substrate. The oxygen radical beam is very highly reactive since it is activated into its excited state. This provides the direct reaction and is suitable for maintaining the increased degree of vacuum since any remaining gas will not be created simultaneously with the production of the oxygen radicals, unlike ozone and nitrogen dioxide.

The oxygen radicals are formed by decomposing the gaseous oxygen $O_2$ into its atomic state under high-frequency discharge within a quartz tube which has a diameter equal to 30 mm and a length equal to 60 mm. The oxygen radicals are then extracted outwardly from the quartz tube through a plurality of elongated openings formed therethrough and extending parallel to each other at the forward end of the quartz tube under a differential pressure between the inside and outside thereof. For example, each of such openings has a diameter equal to 0.3 mm and a length equal to 1.5 mm. Thus, the beam of oxygen radicals have improved directivity.

Since the oxygen radicals are extremely reactive, the oxide film can be more effectively produced by irradiating the oxygen radical beam while maintaining the MBE system at an increased degree of vacuum. The sufficient oxidization of thin film so formed provides an excellent superconducting oxide thin film without the need for any thermal treatment which would insufficiently supply oxygen.

If a mask having a pattern required to produce a device is placed adjacent to a substrate to block a part of the beam so that the oxygen radical beam can be irradiated onto the substrate only at the necessary parts, a superconducting oxide thin film having the desired pattern can be selectively formed without the need for any subsequent heat treating step. As a result, the present invention is expected to provide one step at which the thin film is deposited and patterned simultaneously.

BRIEF DESCRIPTION OF THE DRAWINGS

FIG. 3 is a schematic view illustrating an area adjacent to a substrate which is being irradiated by the oxygen radical beam or the like.

DETAILED DESCRIPTION OF THE INVENTION

The present invention will now be described by referring to some examples thereof and associated drawings.

EXAMPLE 1

Figure 1:
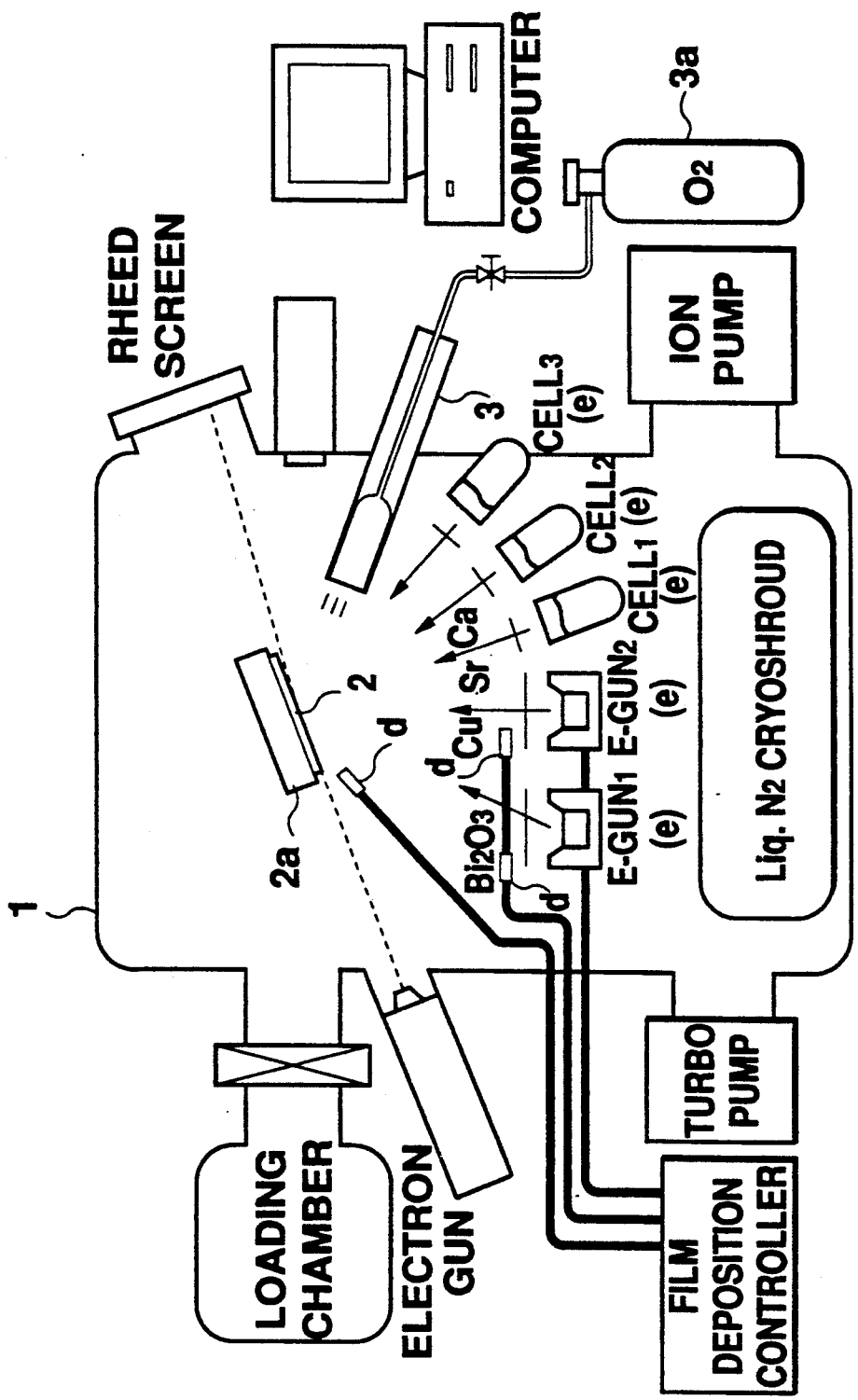
FIG. 1 is a schematic view of a thin film forming system utilizing a molecular beam epitaxy device.

Referring to FIG. 1, there is shown a thin film producing system utilizing a molecular beam epitaxy device. This system comprises a vacuum chamber 1 including five sources of components to be evaporated e, four of which are individually adapted to evaporate bismuth oxide ($Bi_2O_3$), metal strontium (Sr), metal calcium (Ca) and copper (Cu), respectively. These evaporated components are then irradiated toward a substrate 2 in atomic or molecular form.

The system also comprise a radical beam source 3 equipped in the vacuum chamber 1. The radical beam source 3 is adapted to produce oxygen radicals from molecule state oxygen ($O_2$) which is supplied from a supply of oxygen 3a and irradiates oxygen radicals O* toward the substrate 2.

Although the substrate 2 is made of MgO (100) herein, it may be formed of $SrTiO_3$(100) or $YAlO_3$(001).

The substrate 2 is held by a substrate holder 2a within the vacuum chamber 1 which is maintained at a given vacuum level by means of a turbo pump and an ion pump. The interior of the vacuum chamber 1 is also maintained at a predetermined temperature level by a liquid N cryoshroud. The substrate 2 can be loaded or unloaded to the vacuum chamber 1 through a loading chamber.

Only two sources of components to be evaporated e, for $Bi_2O_3$ and Cu, are in the form of an electron gun while the remaining sources are in the form of a crucible. The amount of evaporated component from each of these sources e is individually detected by the respective one of the detectors d. Based on the detected data, a film deposition controller may control the sources e.

An electron gun functions to irradiate an electron beam onto the substrate 2, the crystal structure of which is then investigated by a RHEED screen.

Figure 2:
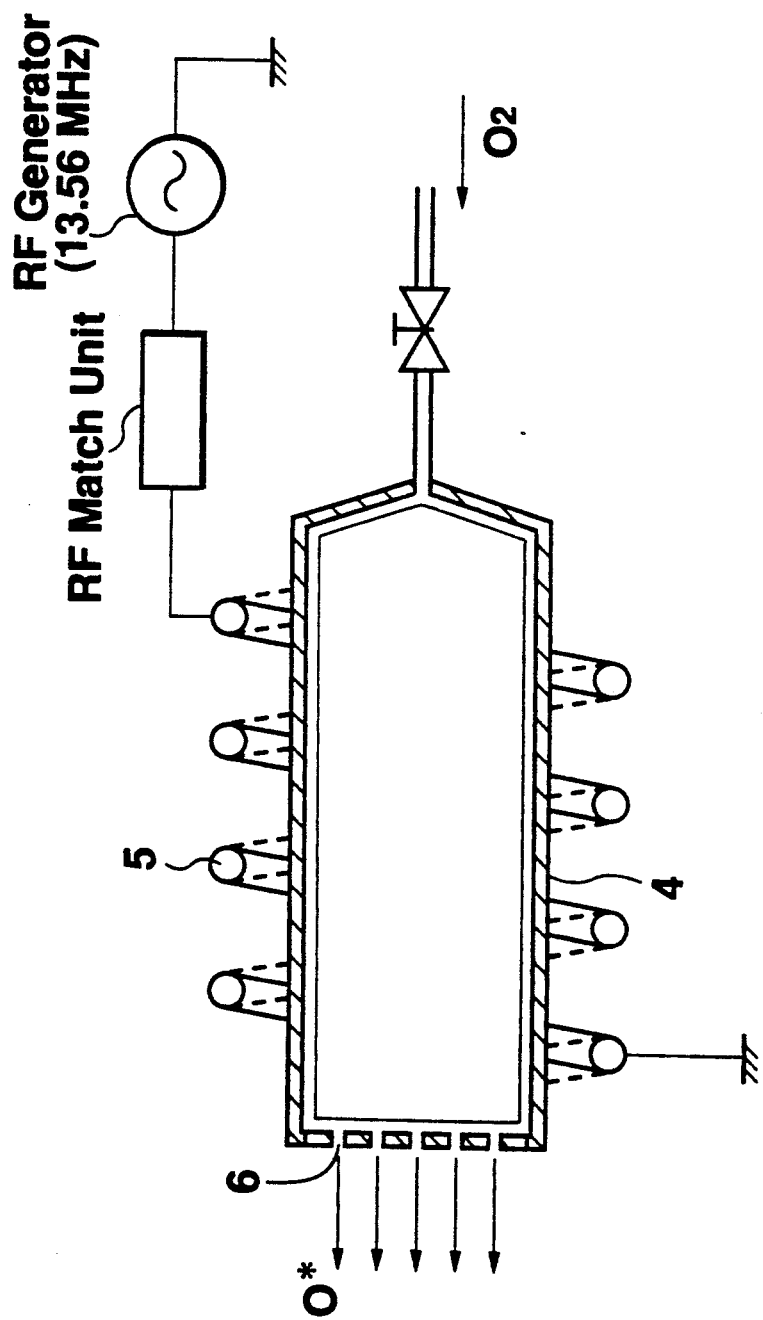
FIG. 2 is a schematic view of an oxygen radical producing device.

FIG. 2 shows the schematic diagram of an oxygen radical producing device which comprises a quartz tube 4 having a diameter equal to 30 mm and a length equal to 60 mm. Oxygen $O_2$ is introduced into the quartz tube 4 and dissociated into oxygen radicals under high-frequency excitation from a high-frequency coil 5. Oxygen radicals produced from the dissociation of oxygen molecules are drawn out of the quartz tube 4, that is, into the interior of the vacuum chamber 1 through 37 elongated openings 6 formed in the quartz tube at its tip end under a differential pressure between the inside and outside of the quartz tube. Each of the openings 6 has a diameter of 0.3 mm and a length of 1.5 mm. This can realize a beam of oxygen radicals improved in directivity, which will be directed toward the substrate 2.

It is suitable that the distance between the tip or forwardmost end of the quartz tube 2 and the substrate 2 is equal to 100 mm.

The high-frequency coil 5 receives a high-frequency current whose frequency is equal to 13.56 MHz, which is generated by an RF generator through an RF match unit.

The amount of gaseous oxygen $O_2$ supplied to the quartz tube 4 may be adjusted by a valve.

Figure 3:
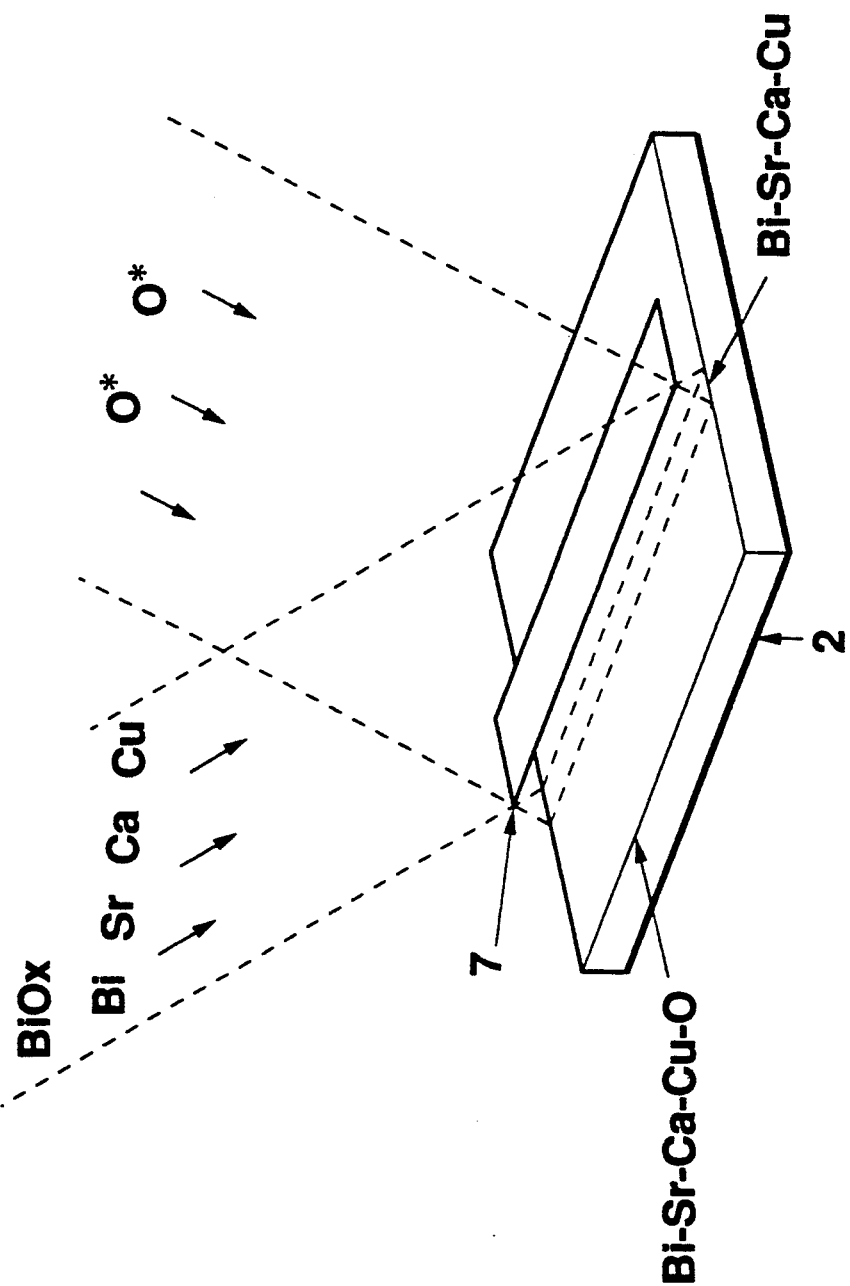

FIG. 3 shows a schematic diagram of an area adjacent to the substrate 2 onto which the bismuth oxide $Bi_2O_3$, Sr, Ca and Cu in the atomic or molecular state and the oxygen radicals are irradiated. As will be apparent therefrom, the irradiation of the oxygen radicals O* are controlled by means of a mask 7. That portion of the substrate behind the mask 7 will not be oxidized.

In such a manner, a thin film of Bi-Sr-Ca-Cu-O will be formed by irradiating $Bi_2O_3$, Sr, Ca and Cu and the oxygen radicals O* onto the heated substrate 2. The components $Bi_2O_3$, Sr, Ca Cu are sequentially deposited onto the substrate 2 in the following sequence: Bi-Sr-Cu-Ca-Cu-Sr-Bi.

The rate of evaporation of each of the components was substantially as follows:

$Bi_2O_3$: 0.125 nm/second
Sr: 0.220 nm/second
Cu: 0.040 nm/second
Ca: 0.220 nm/second
O*: $1 \times 10^{16}$ species/second cm$^2$ (irradiation rate)

The opening time for each component source to be evaporated (i.e. time for which the respective shutter is opened in a sequence) was as follows:

$Bi_2O_3$: 3.02 seconds
Sr: 4.02 seconds
Cu: 2.90 seconds
Ca: 3.85 seconds

Although the opening and closing of the shutter are repeated 100 times in the example 1, any number of opening and closing cycles may be selected as long as it is at least 10 cycles.

Thin films of Bi-Sr-Ca-Cu-O having a thickness ranging between 160 nm and 250 nm were obtained when the temperature of the substrate was in the range between 650° C. and 750° C. and the growth rate of the thin film was in the range between 0.06 nm/second and 0.20 nm/second.

Although the components $Bi_2O_3$, Sr, Ca and Cu and the oxygen radicals O* were simultaneously irradiated onto the substrate 2 in the example 1, the oxygen radicals O* may be irradiated onto the substrate 2 after each deposition in the sequence of Bi-Sr-Cu-Ca-Cu-Sr-Bi.

Figure 4:
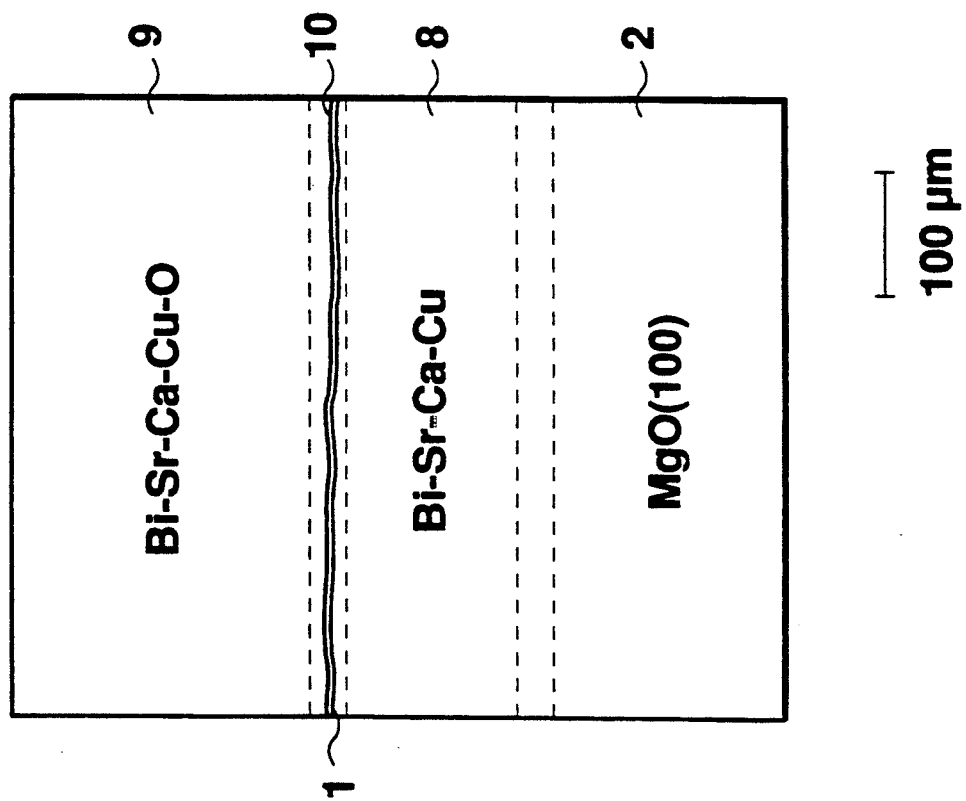
FIG. 4 is a diagrammatic sketch of a photograph illustrating the surface of a thin film which comprises a substrate and oxidized and non-oxidized film sections formed thereon.

FIG. 4 shows the diagrammatic view of a photograph illustrating the state of the boundary (on the film surface) between an oxidized film portion (thin film of Bi-Sr-Ca-Cu-O) and a non-oxidized film portion (thin film of Bi-Sr-Ca-Cu), which are formed on the substrate 2. As will be apparent from this photograph, the width of the boundary area 10 between the non-oxidized and oxidized film portion 8 and 9 is very narrow, in the range between 10 μm and 20 μm. This results from the oxidization by the direct reaction of the oxygen radicals. FIG. 4 also shows the fact that the oxygen radical beam has improved directivity.

Figure 5:
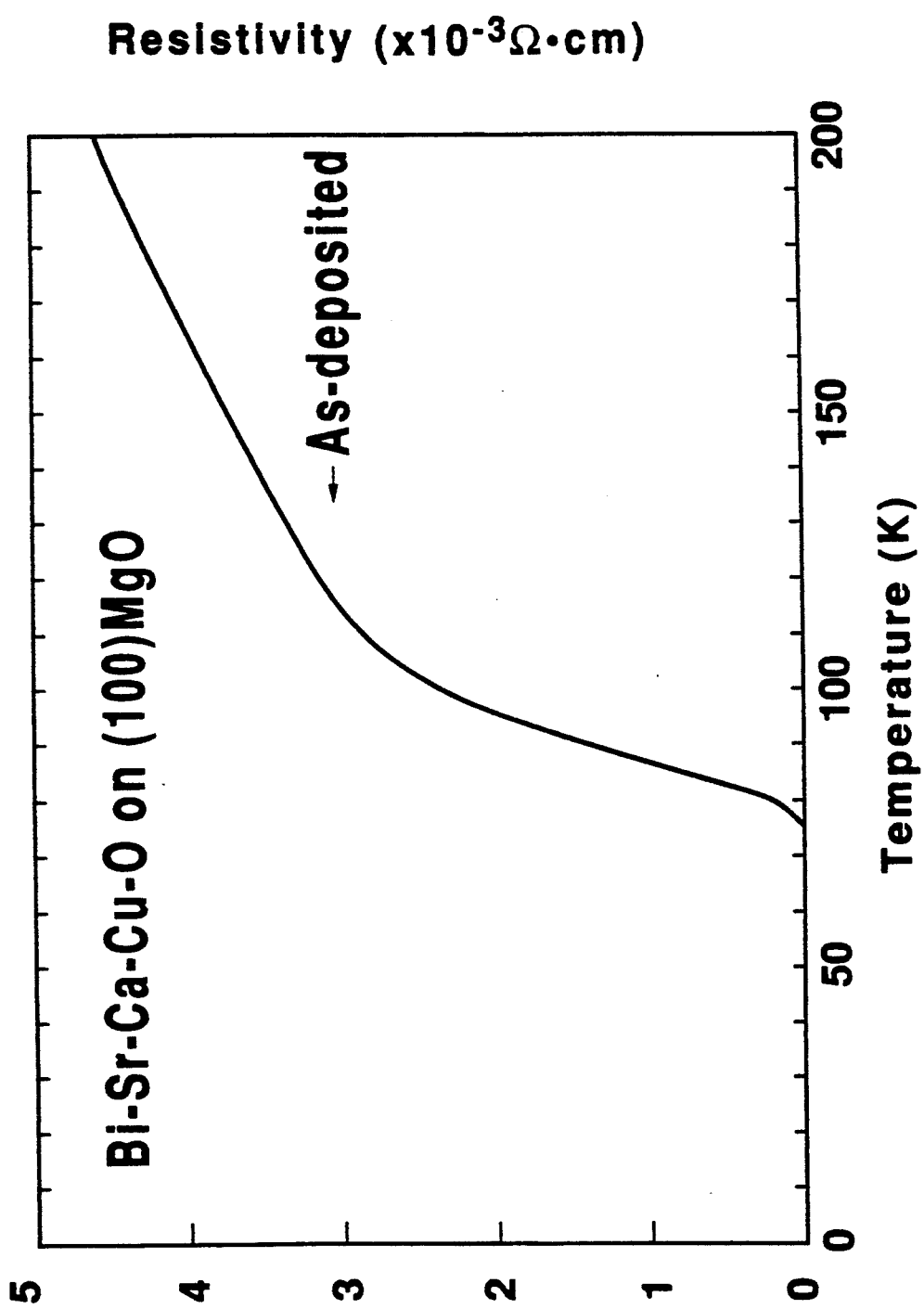
FIG. 5 is a graph illustrating the electric resistance characteristic in a thin film of Bi-Sr-Ca-Cu-O formed in the first example of the present invention.

On measuring the resistance and temperature characteristics of the Bi-Sr-Ca-Cu-O thin film 9 formed in the oxidized film portion, such a graph as shown in FIG. 5 was plotted. This thin film exhibited superconductivity in the as-deposited sate without any heat treatment. The temperature with zero resistance Tc (end) was 75 K. The non-oxidized film portion 8 did not exhibit superconductivity. When the x-ray diffraction pattern of the thin film was measured to investigate the crystalline structure thereof, the composition of the oxidized film portion was $Bi_2Sr_2Ca_1Cu_2O_y$. On the other hand, the definite structure of the non-oxidized film portion was not found. Although the example 1 has been described as to the process of making the superconducting oxide thin film of Bi components, the present invention may be applied to other processes of making superconducting oxide thin films of Y(rare-earth-metal) based and Tl based compounds. In the latter case, for example, the temperature of the substrate 2 may be in the range between 550° C. and 700° C.

EXAMPLE 2

Figure 6:
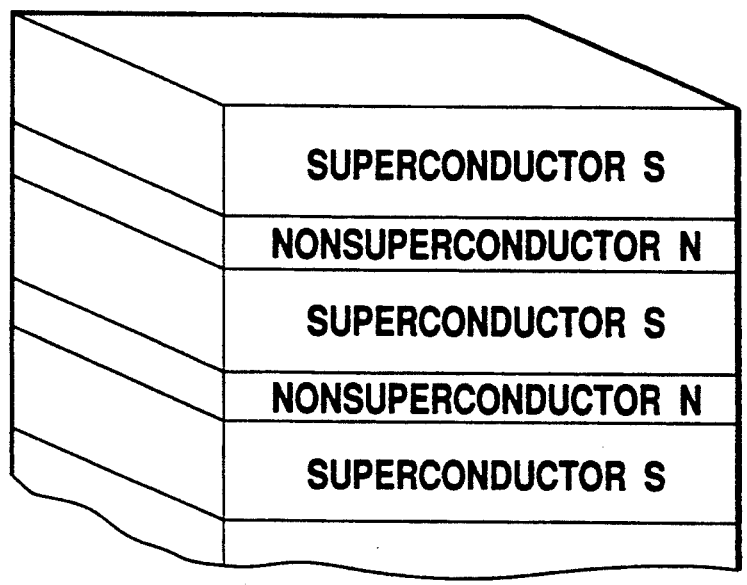
FIG. 6 is a diagrammatic view of a superconducting superlattice.

By changing the sequence of each of the shutters located in the respective sources of component to be evaporated, which is opened and closed, a superconducting superlattice was formed which comprises an alternate lamination of nonsuperconducting layers ($Bi_2Sr_2Cu_1O_6$) and superconducting layers ($Bi_2Sr_2Ca_1Cu_2O_8$), as shown in FIG. 6. If it is assumed that the nonconducting layer is layer N and the superconducting layer is layer S, the superconducting superlattice had a S-N-S structure which was repeated as shown by S-N-S-N-S . . . S-N-S-N-S. Namely, this would provide a S-N-S array along C-axis direction.

Figure 7:
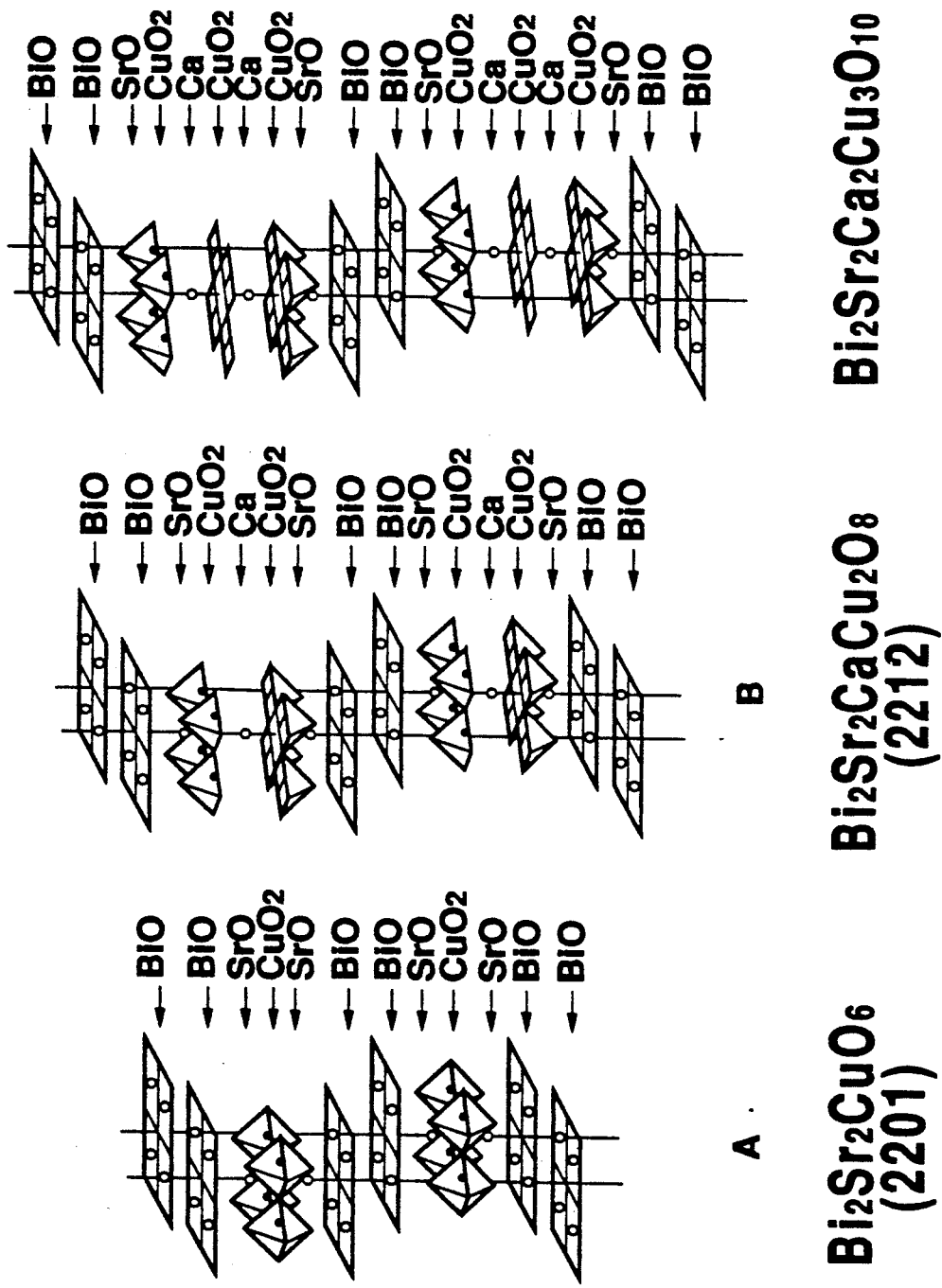
FIG. 7 illustrates crystalline structures of Bi-Sr-Ca-Cu-O.

The components $Bi_2O_3$, Sr, Ca and Cu and the oxygen radicals O* were irradiated onto the heated substrate 2 to form a superlattice structure of Bi-Sr-Ca-Cu-O. If it is to form a nonsuperconducting layer ($Bi_2Sr_2Cu_1O_6$), $Bi_2O_3$, Sr and Cu will be sequentially deposited in the sequence of Bi-Sr-Cu-Sr-Bi. This sequence is represented by sequence A and it corresponds to 2201 phase (FIG. 7).

On the other hand, if it is to form a superconducting layer ($Bi_2Sr_2Ca_1Cu_2O_8$), BiOx, Sr, Ca and Cu will be sequentially deposited in the sequence of Bi-Sr-Cu-Ca-Cu-Sr-Bi. This sequence is represented by sequence B and it corresponds to 2212 phase (FIG. 7).

On the growth of a thin film, sequence A and B are alternately repeated to form a superlattice structure consisting of an alternate lamination of nonsuperconducting phases ($Bi_2Sr_2Cu_1O_6$) and superconducting phases ($Bi_2Sr_2Ca_1Cu_2O_8$).

In the example 2, the amount of each of the evaporated components was substantially as follows:

$Bi_2O_3$: 0.100 nm/second
Cu: 0.020 nm/second
Sr: 0.100 nm/second
Ca: 0.100 nm/second
O*: $1 \times 10^{16}$ species/second $cm^2$ (irradiation rate)

The opening time for each component source to be evaporated (i.e. time for which the respective shutter is opened in a sequence) was as follows:

$Bi_2O_3$: 3.20 seconds
Cu: 3.80 seconds
Sr: 3.40 seconds
Ca: 3.50 seconds (These time periods are at the substrate temperature which will be described below. They will be in the range between about 3.00 seconds and about 4.00 seconds even if the temperature of the substrate is varied.)

The other conditions on production were as follows:
Growth rate: 0.01–0.10 nm/second
Temperature of Substrate: 600°–750° C.
Film thickness: 20–200 nm
Material of substrate used: MgO (100) or $SrTiO_3$ (100) or $YAlO_3$ (001)

Under the above conditions, a superlattice of Bi-Sr-Ca-Cu-O was produced which comprises an alternate lamination consisting of six nonsuperconducting layers ($Bi_2Sr_2Cu_1O_6$) each having a thickness equal to 36 angstroms and six superconducting layers ($Bi_2Sr_2Ca_1Cu_2O_8$) each having a thickness equal to 30 angstroms. In this case, the sequence A was repeated three times to form each nonsuperconducting layer while the sequence B was repeated two times to form each superconducting layer. Namely, the sequence A and B were repeatedly arranged as shown by $(AAABB) \times 6$.

Figure 8:
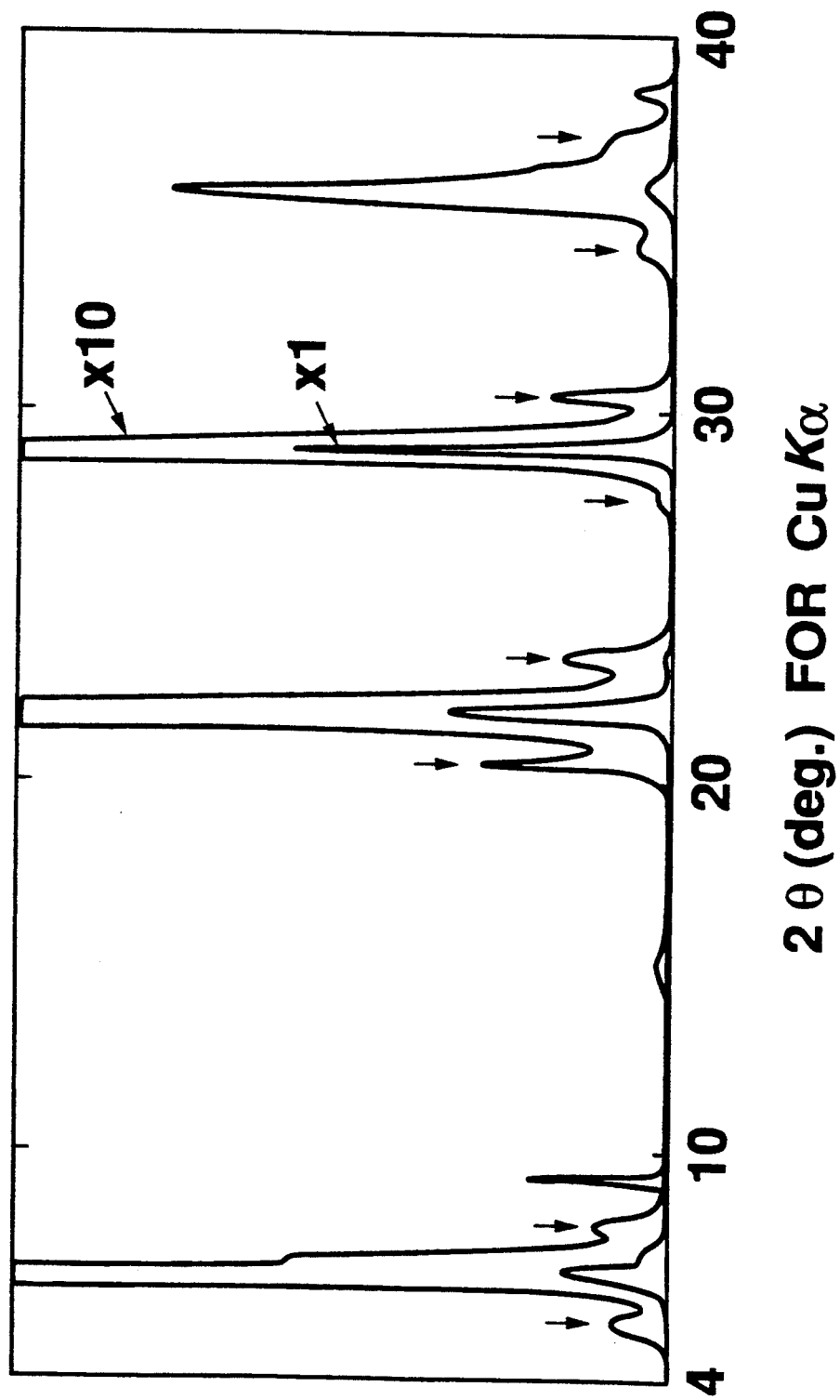
FIG. 8 is a graph illustrating the x-ray diffraction pattern of a superlattice.

The x-ray diffraction pattern of the superlattice so formed is shown in FIG. 8. This pattern corresponds to 6.6 nm of the long period. Satellite diffraction curves (i.e. lower peaks on the both sides of each of the main diffraction curves) are also observed as shown by arrows. It is thus understood that a single crystal thin film of the superlattice structure comprising an alternate lamination consisting of nonsuperconducting layers each having its thickness equal to 36 angstroms and superconducting layers each having its thickness equal to 30 angstroms is formed on the substrate 2.

Figure 9:
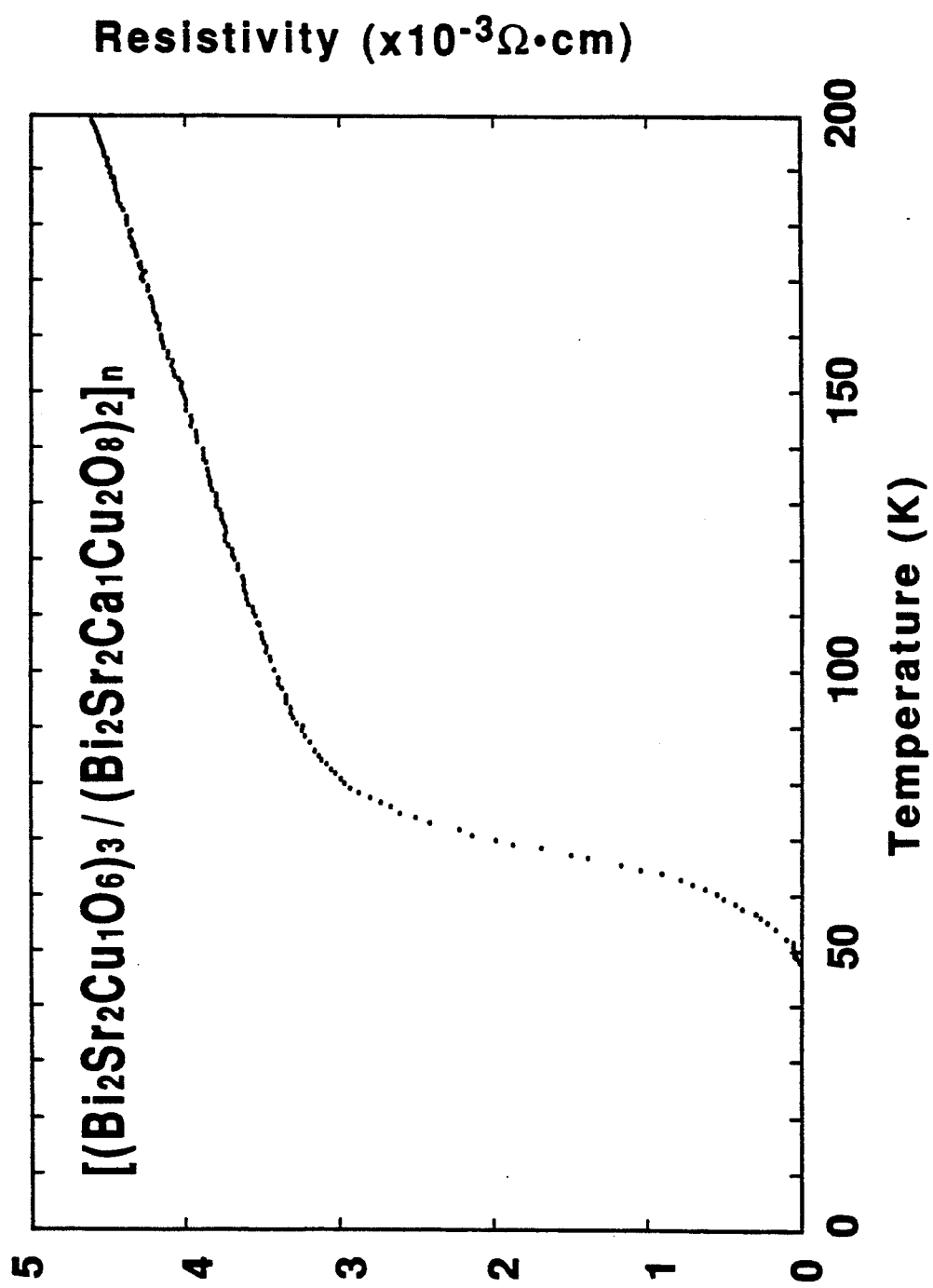
FIG. 9 is a graph illustrating the resistance-temperature characteristics of the superlattice structure of Bi-Sr-Ca-Cu-O.

The measurements of the resistance-temperature characteristics of the formed Bi-Sr-Ca-Cu-O superlattice are shown in FIG. 9. When the thin film having such a superlattice was electrically energized by an electric current flowing therein parallel to the film surface and measured with the dependency of the electric resistance on the temperature, it exhibited superconductivity with the superconductivity transient temperature Tc(onset) being 90K and the zero resistance temperature Tc(end) being in the range between 35K and 50K.

The superconducting layers of $Bi_2Sr_2Ca_1Cu_2O_8$ may be replaced by superconducting layers of $Bi_2Sr_2Ca_2Cu_3O_{10}$. In this case, the sequence of deposition is Bi-Sr-Cu-Ca-Cu-Ca-Cu-Sr-Bi. This corresponds to 2223 phase (FIG. 7).

EXAMPLE 3

As in the example 2, a superlattice structure was formed which comprises an alternate lamination consisting of nonsuperconducting layers ($Bi_2Sr_2Cu_1O_6$) and superconducting layers ($Bi_2Sr_2Ca_1Cu_2O_8$). By repeating each of the sequences A and B a number of times for each deposition, the thickness of each of the nonsuperconducting and superconducting layers can be controlled.

In other words, the alternate lamination of the example 3 comprising the nonsuperconducting layers N and the superconducting layers S is similar to that of the example 2, but the example 3 is characterized by the repetition of each of the nonsuperconducting and superconducting layers N and S a number of times for each deposition. Thus, the example 3 provides a superlattice structure comprising (N)n(S)m(N)n(S)m(N)n(S)m . . . although the example 2 provides a superlattice structure comprising NSNSNS . . . Since the above subscripts n and m can be freely changed by suitably setting the conditions, one can provide an alternate lamination consisting of nonsuperconducting and superconducting layers each having the desired thickness.

In the example 3, the amount of each of the evaporated components was substantially as follows:
$Bi_2O_3$: 0.100 nm/second
Cu: 0.020 nm/second
Sr: 0.100 nm/second
Ca: 0.100 nm/second
O*: $1 \times 10^{16}$ species/second $cm^2$ (irradiation rate)

The opening time for each component source to be evaporated (i.e. time for which the respective shutter is opened) was as follows:
$Bi_2O_3$: 3.30 seconds
Cu: 3.65 seconds
Sr: 3.50 seconds
Ca: 3.30 seconds
(These time periods are at the substrate temperature which will be described below. They will be in the range between about 3.00 seconds and about 4.00 seconds even if the temperature of the substrate is varied.)

The other conditions on production were as follow:
Growth Rate: 0.01–0.10 nm/second
Temperature of Substrate: 600°–750° C.
Film thickness: 20–200 nm
Material of substrate used: MgO (100) or $SrTiO_3$ (100) or $YAlO_3$(001)

By changing the conditions on production in such a manner, the thickness of each of the nonsuperconducting and superconducting layers and their ratio of thickness can be controlled freely.

After formation, the thin film was naturally cooled to 300° C. for about 15 minutes while irradiating the oxygen radical beam. This is to prevent the desorption of oxygen from the thin film immediately after being formed. The composition of the formed film is analyzed by the use of an EPMA (electron probe microanalyser) which can observe the two-dimensional atomic distribution by scanning the surface of a specimen with an electron beam. The crystalline structure is estimated by RHEED (reflection high energy electron diffraction) and XRD (x-ray diffraction).

Under the above conditions, a superlattice structure was formed which consisted of 10–15 nonsuperconducting layers ($Bi_2Sr_2Cu_1O_6$) and 10–15 superconducting layers ($Bi_2Sr_2Ca_1Cu_2O_8$).

A specimen having Bi-components superlattice can be grown by the layer-by-layer MBE process, but the example 3 produced two types of specimens each of which comprised one superconducting layer or four superconducting layers.

Figure 10:
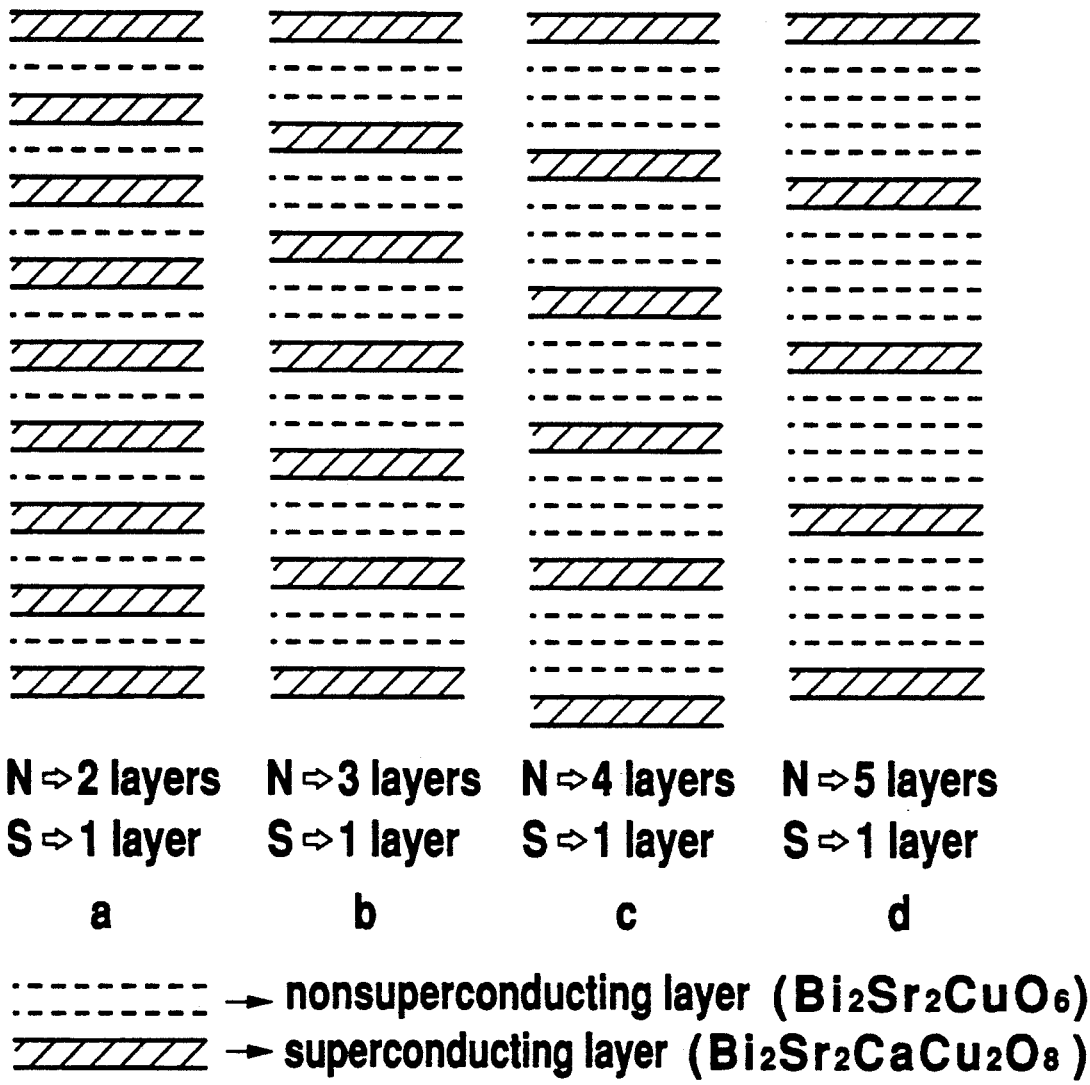
FIG. 10 is a diagrammatic view of a superlattice film $[(Bi_2Sr_2Cu_1O_6)_n/(Bi_2Sr_2Ca_1Cu_2O_8)_1]_{15}$ formed in the third example of the present invention.

The structure of the one superconducting layer type specimen is $[(Bi_2Sr_2Cu_1O_6)_n/(Bi_2Sr_2Ca_1Cu_2O_8)_1]_{15}$ (n=2-5), as shown in FIG. 10.

Figure 11:
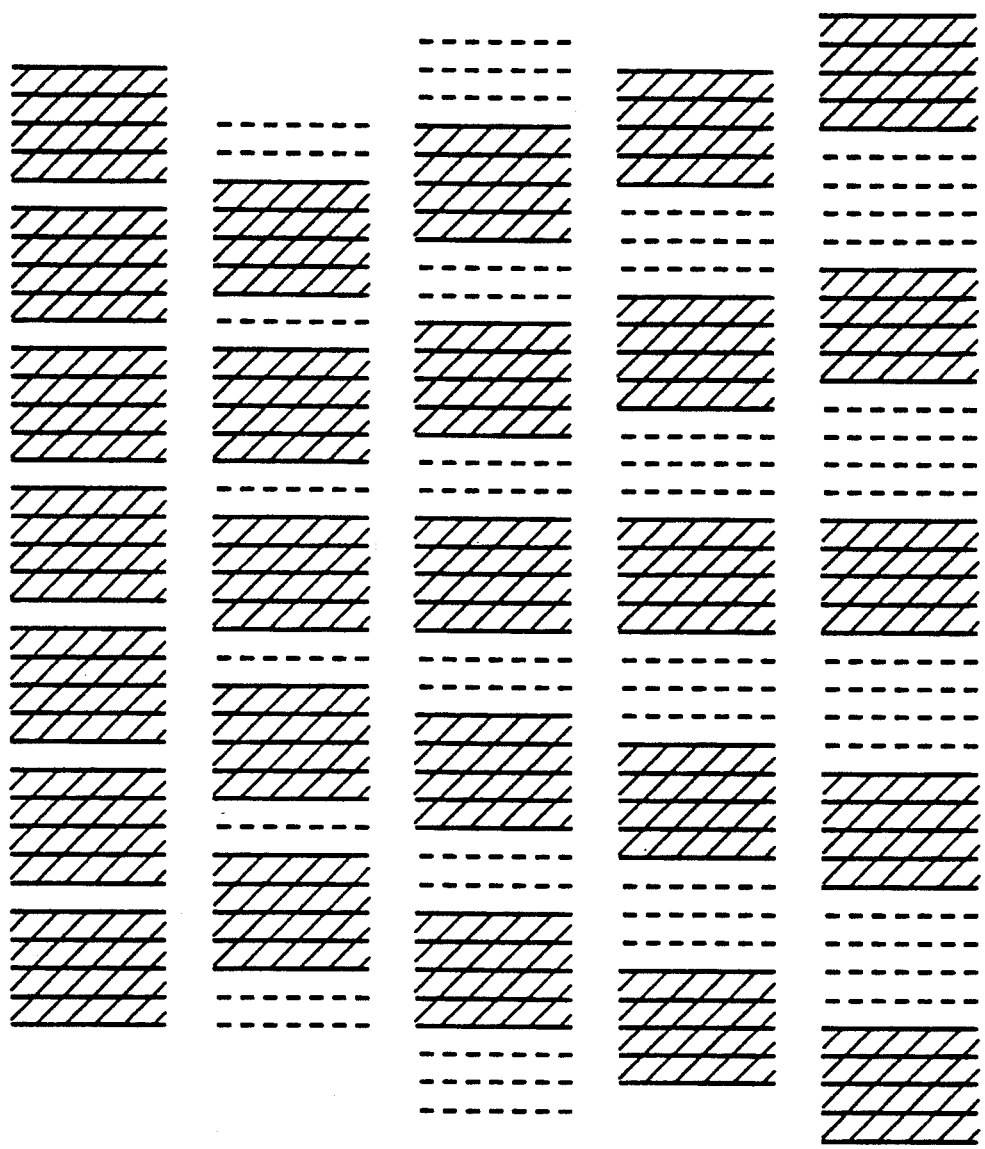
FIG. 11 is a diagrammatic view of a superlattice film $[(Bi_2Sr_2Cu_1O_6)_n/(Bi_2Sr_2Ca_1Cu_2O_8)_4]_{10}$ formed in the third example of the present invention.

The structure of the four superconducting layer type specimen is $[(Bi_2Sr_2Cu_1O_6)_n/(Bi_2Sr_2Ca_1Cu_2O_8)_4]_{15}$ (n=1-5), as shown in FIG. 11.

When the one superconducting layer type specimen was being formed, the sequence of opening and closing in the source shutters (shutter sequence) is n times for the sequence A and one time for the sequence B, with such a cycle being repeated fifteen times. When the four superconducting layer type specimen was being formed, the sequence of opening and closing in the source shutters (shutter sequence) is n times for the sequence A and four times for the sequence B, with such a cycle being repeated fifteen times.

Figure 12:
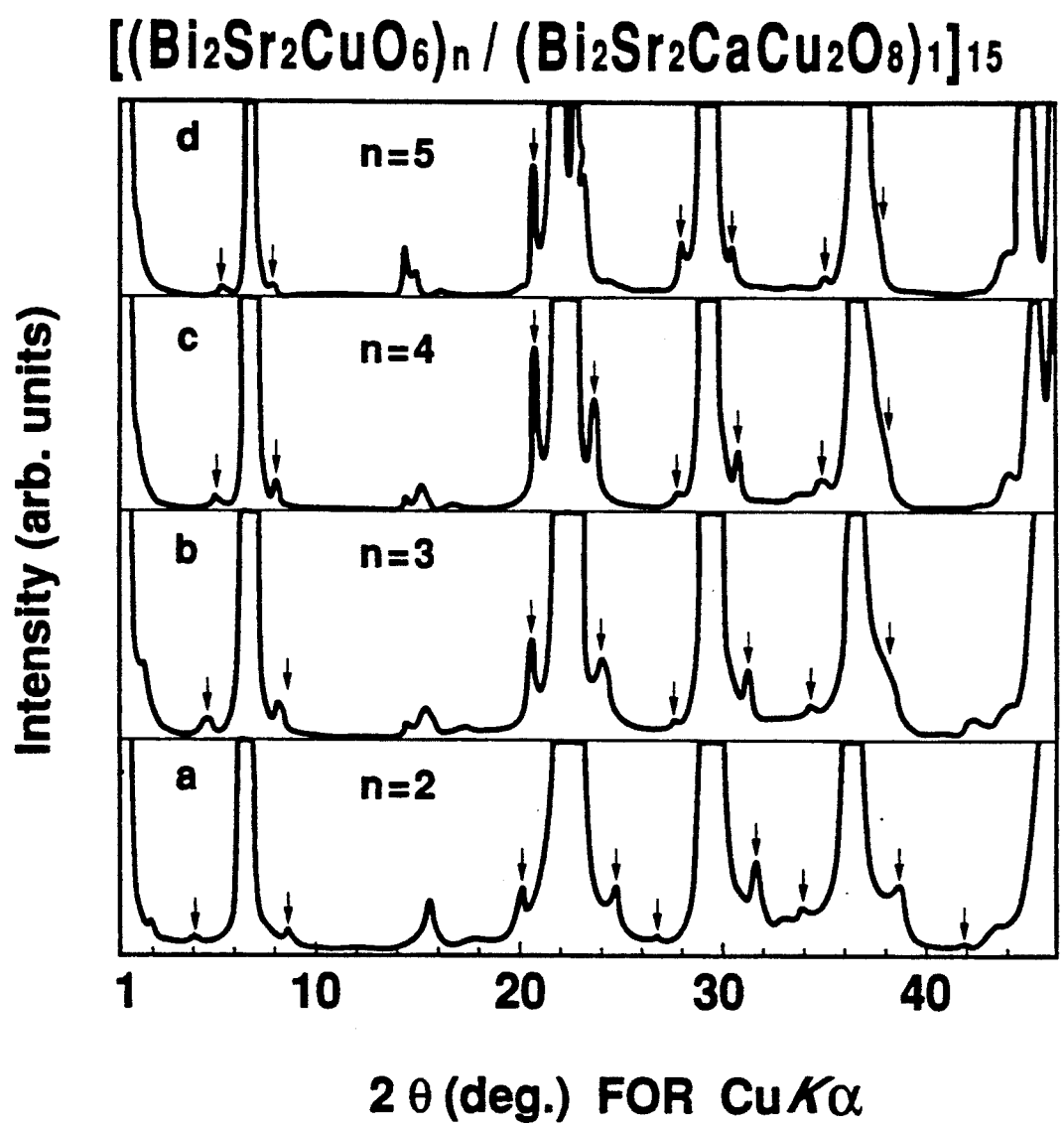
FIG. 12 is a graph illustrating the x-ray diffraction pattern of the superlattice film $[(Bi_2Sr_2Cu_1O_6)_n/(Bi_2Sr_2Ca_1Cu_2O_8)_1]_{15}$ formed in the third example of the present invention.
Figure 13:
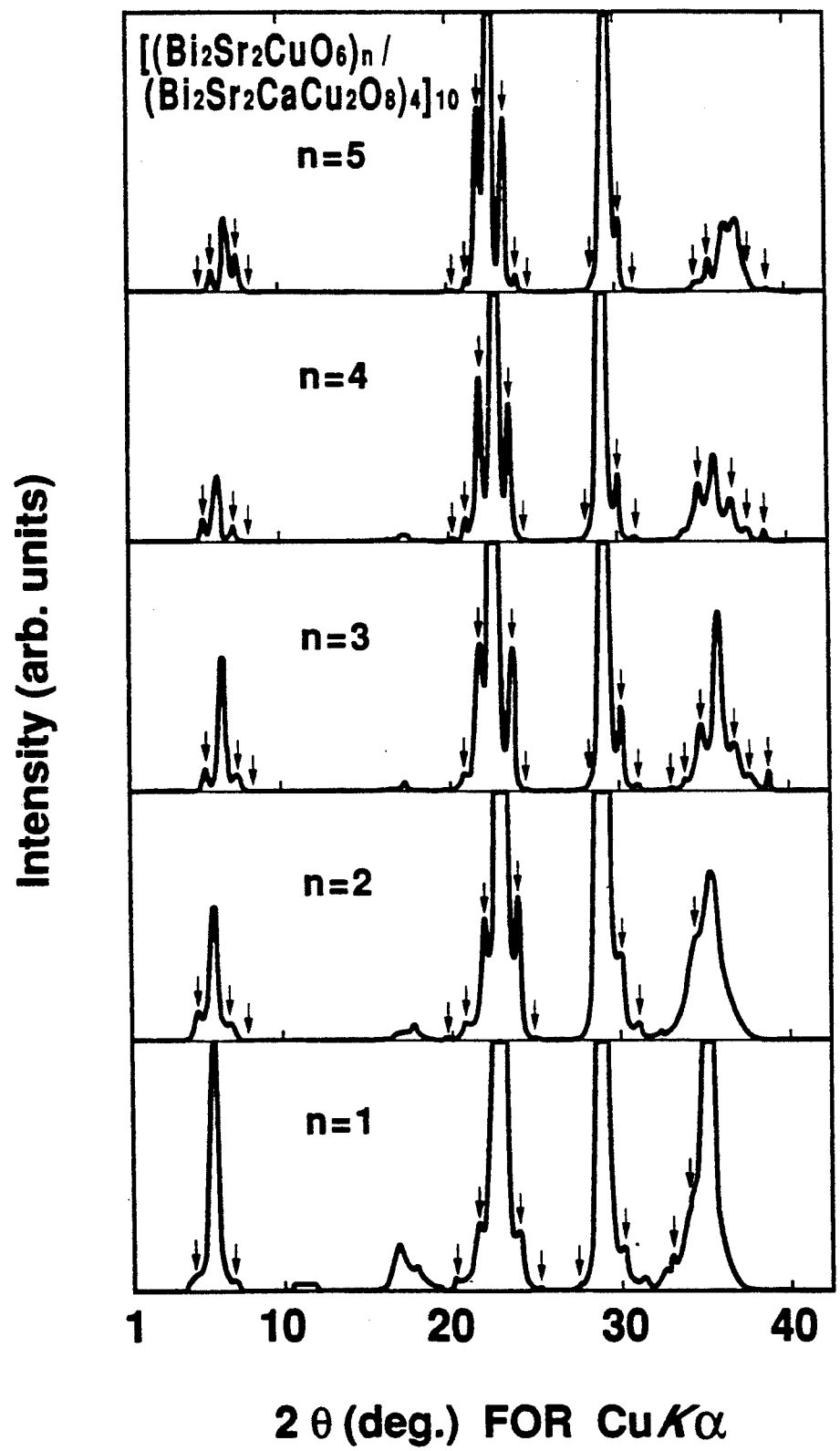
FIG. 13 is a graph illustrating the x-ray diffraction pattern of the superlattice film $[(Bi_2Sr_2Cu_1O_6)_n/(Bi_2Sr_2Ca_1Cu_2O_8)_4]_{10}$ formed in the third example of the present invention.

All the RHEED patterns (not shown) of the respective specimen surfaces were of a streak type which exhibited the epitaxial growth. In order to confirm the production of the long period structures corresponding to the shutter sequences, the x-ray diffraction patterns of the thin films were observed as shown in FIGS. 12 and 13. This observation discovered satellite diffraction curves (i.e. lower peaks on the both sides of each of the main diffraction curves) which corresponded to the long period structures caused by multi-layers. From this fact, it is understood that the spacing of the lower peaks is decreased more as the cycle is increased.

On calculating the long periods from these diffraction curves, the one superconducting layer type film has the long periods equal to 3.98, 5.22, 6.45 and 7.68 nm while the four superconducting layer type film has the long periods equal to 7.4, 8.6, 9.8, 11.0 nm. This means that the long periods are increased by about 1.23 nm which corresponds to ½ unit cell in the 2201 phase. From this fact, it is understood that the changing of the shuttering sequence can produce a superlattice consisting of 2201 phase and 2212 phase. Further, this shows that a thin film controlled in phase in the C-axis direction can be produced by each ½ unit cell.

Figure 14:
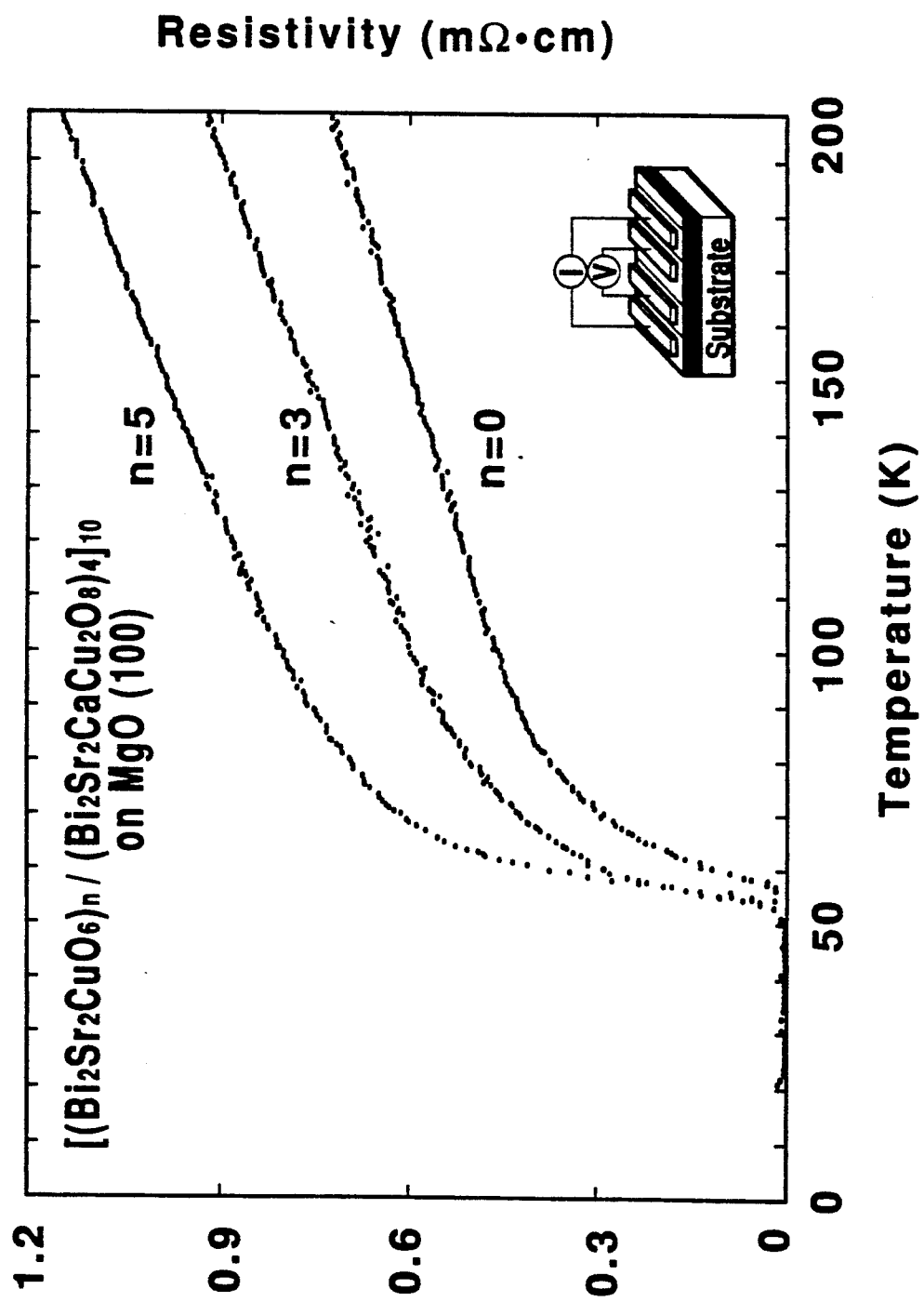
FIG. 14 is a graph illustrating the resistance-temperature characteristics of the superlattice film $[(Bi_2Sr_2Cu_1O_6)_n/(Bi_2Sr_2Ca_1Cu_2O_8)_4]_{10}$ formed in the third example of the present invention.

FIG. 14 shows the resistance-temperature characteristics of the Bi-Sr-Ca-Cu-O superlattice (of four superconducting layers) which were measured by flowing the electric current in the film parallel to the film surface with the conventional four terminal measuring process. The fact that Tc(end) is substantially not variable and remains at about 50K even if there are changes of n=0, n=3 and n=5 shows that Tc(end) is invariable even if the thickness of the 2201 layer (nonsuperconducting layer) is variable. Namely, the thickness of each of the layers is regularly controlled for each layer.

On the other hand, the one superconducting layer type film (not shown) has Tc(onset) equal to 70K even if it has two–four nonsuperconducting layers. This exhibits that the thin film was formed into a regular lamination configuration without any disturbance. It is expected that such a thin film can be used as a device having better characteristics.

Since the process of the present invention for producing a superconducting oxide thin film is characterized by the fact that the superconducting oxide thin film can be formed by irradiating the oxygen radical beam with the elements of the compound of the superconducting oxide thin film onto the substrate, a higher degree of vacuum can be maintained with the direct reaction being realized more efficiently. The superconducting oxide thin film can be selectively formed on the substrate by the use of the oxygen radical (nascent state oxygen) beam without any subsequent heat treatment.

In accordance with the present invention, furthermore, a superlattice structure can be formed which comprises an alternate lamination consisting of nonsuperconducting and superconducting layers in any sequence of deposition, each of these layers having the desired thickness.

We claim:

1. A method of making a superconducting oxide thin film by the use of a molecular beam epitaxy process (MBE process), said method comprising the steps of:
   (a) forming molecular beams from the elements of a compound of the superconducting oxide thin film;
   (b) forming an oxygen radical beam in a tube made of insulating material and having an output end provided with a plurality of openings; and
   (c) irradiating said oxygen radical beam through the apertures and with said molecular beams onto a substrate mounted in a molecular beam epitaxy system to form said superconducting oxide thin film.

2. A method as defined in claim 1, further comprising the step of controlling the amounts of said oxygen radical beam and molecular beams to control the composition of the thin film formed on said substrate, thereby forming a nonsuperconducting oxide thin film.

3. A method as defined in claim 2 wherein a superlattic having an alternate lamination consisting of superconducting and nonsuperconducting layers is formed on said substrate by alternately depositing said superconducting and nonsuperconducting layers on said substrate.

4. A method as defined in claim 3 wherein the thickness of each of said superconducting and nonsuperconducting layers in said superlattice is individually varied to form said superlattice.

5. A method as defined in claim 4 wherein said layer thickness controlling step includes controlling the time of irradiation for said molecular beams of the elements of the compound of said superconducting oxide and the time of irradiation for said oxygen radical beam.

6. A method as defined in claim 1 wherein said oxygen radical beam forming step includes dissociating oxygen atoms under high-frequency discharge to produce oxygen radicals.

7. A method as defined in claim 6 wherein said molecular beam forming step includes evaporating the elements of the compound of the superconducting oxide.

8. A method as defined in claim 7, further including the step of blocking at least one of the molecular beams for a given time period.

9. A method as defined in claim 8 wherein the elements of the compound of said superconducting oxide are selected from the group consisting of Bi, Sr, Ca, Cu, Y, Ba, Tl and O.

10. A method as defined in claim 1, wherein the tube is a quartz tube.

11. A method as defined in claim 1, further comprising the step of disposing a mask between the tube and the substrate in order to prevent oxygen radicals in the beam from striking a part of the substrate, whereby a non-superconductive area is formed on that part of the substrate.

* * * * *